US012258143B2

(12) United States Patent
Whitehouse et al.

(10) Patent No.: US 12,258,143 B2
(45) Date of Patent: Mar. 25, 2025

(54) METHOD OF CONFIGURING A WING-MOUNTED TURBINE FOR GENERATING ELECTRICITY AND INCREASING THRUST

(71) Applicant: Continuum Dynamics, Inc., Ewing, NJ (US)

(72) Inventors: Glen R. Whitehouse, Skillman, NJ (US); Todd R. Quackenbush, Ringoes, NJ (US)

(73) Assignee: Continuum Dynamics, Inc., Ewing, NJ (US)

( * ) Notice: Subject to any disclaimer, the term of this patent is extended or adjusted under 35 U.S.C. 154(b) by 0 days.

(21) Appl. No.: 18/440,997

(22) Filed: Feb. 14, 2024

(65) Prior Publication Data
US 2024/0270404 A1    Aug. 15, 2024

Related U.S. Application Data

(60) Provisional application No. 63/445,515, filed on Feb. 14, 2023.

(51) Int. Cl.
*B64D 41/00* (2006.01)
*F03D 9/32* (2016.01)
(Continued)

(52) U.S. Cl.
CPC ........... *B64D 41/007* (2013.01); *G06F 30/15* (2020.01); *G06F 30/28* (2020.01); *B64F 5/00* (2013.01);
(Continued)

(58) Field of Classification Search
CPC ....... B64D 41/007; G06F 30/15; G06F 30/28; B64F 5/00; F03D 1/0633; F03D 9/322; F05D 2220/76; F05D 2260/81
See application file for complete search history.

(56) References Cited

U.S. PATENT DOCUMENTS 4,045,144 A    8/1977 Loth
4,917,332 A    4/1990 Patterson, Jr.
(Continued)

FOREIGN PATENT DOCUMENTS

WO    2013083570    6/2003

OTHER PUBLICATIONS

Capellaro et al. An Iterrative Method to Optimize the Twist Angle of a Wind Turbine Rotor Blade Wind Engineering, vol. 38, No. 5, pp. 489-498, 2014 (Year: 2014).*
(Continued)

*Primary Examiner* — Rehana Perveen
*Assistant Examiner* — Cuong V Luu
(74) *Attorney, Agent, or Firm* — David M. Quinlan, P.C.

(57) ABSTRACT

A turbine mounted behind an aircraft wing provides a specified proportion of a propulsive force in the aircraft flight direction to an amount of power generated by the turbine when driven by the airflow trailing the wing. The turbine converts a portion of the otherwise wasted energy in the rotational vortices trailing the aircraft wing into thrust that reduces aircraft drag while also providing electricity to power electrical systems on the aircraft. In one embodiment, the method used to construct the turbine saves computation time by using an optimization routine to define a preliminary turbine configuration based on an idealized vortex model and then matches it to the flow trailing an actual aircraft wing. The method is also capable of modeling a turbine construction that will use the energy in the wake solely to generate electricity without increasing drag on the aircraft or solely to reduce drag without generating electricity.

28 Claims, 8 Drawing Sheets

(51) Int. Cl.
| | |
|---|---|
| *G06F 30/15* | (2020.01) |
| *G06F 30/28* | (2020.01) |
| *B64F 5/00* | (2017.01) |
| *F03D 1/06* | (2006.01) |

(52) U.S. Cl.
CPC ............ *F03D 1/0633* (2013.01); *F03D 9/322* (2023.08); *F05D 2220/76* (2013.01); *F05D 2260/81* (2013.01)

(56) References Cited

U.S. PATENT DOCUMENTS

| | | | |
|---|---|---|---|
| 5,100,085 | A | 3/1992 | Rubbert |
| 5,150,859 | A * | 9/1992 | Ransick ................ B64C 23/065 290/55 |
| 5,407,153 | A | 4/1995 | Kirk et al. |
| 5,918,835 | A | 7/1999 | Gerhardt |
| 5,934,612 | A | 8/1999 | Gerhardt |
| 6,042,059 | A | 3/2000 | Bilanin et al. |
| 6,484,968 | B2 | 11/2002 | Felker |
| 2006/0006290 | A1 | 1/2006 | Loth |
| 2016/0229527 | A1* | 8/2016 | Duke ..................... B64D 27/12 |

OTHER PUBLICATIONS

Liu et al. Optimized Linearization of Chord and Twist Angle Profiles for Fixed-Pitch Fixed-Speed Wind Turbine Blades Renewable Energy 57, pp. 111-119 (Year: 2013).*
Scully, M.P., "Computation of Helicopter Rotor Wake Geometry and Its Influence on Rotor Harmonic Airloads," Massachusetts Institute of Technology Aerospace Structures Research Laboratory, Report ASRL TR 178-1, Feb. 1975.
C.duP. Donaldson et al., "Vortex Wake of Conventional Aircraft," AGARDograph No. 204, AGARD-AG-204, May 1975.
Whitcomb, R.T., "A Design Approach and Selected Wind-Tunnel Results at High Subsonic Speeds for Wing-Tip Mounted Winglets," NASA Report No. NASA TN D-8260, Langley Research Center, Langley, VA, Jul. 1976.
Johnson, W., "A Comprehensive Analytical Model of Rotorcraft Aerodynamics and Dynamics," NASA Technical Memorandum 81182, Jun. 1980.
Man, S.O., "Experiments on Vortex Energy Recovery by Favourable Interference between Wing and Shrouded Fan," Thesis for Master of Science Degree in Aeronautical Engrg., Wichita State Univ., Dec. 1981.
Burnham, D.C., "B-747 Vortex Alleviation Flight Tests: Ground Based Sensor Measurements," DOT-FAA-RD-81-99, Feb. 1982.
Patterson, J.C., Jr., et al., "Exploratory Wind-Tunnel Investigation of a Wingtip Mounted Vortex Turbine for Vortex Energy Recovery," NASA Report No. NASA TP-2468, Langley Research Center, Jun. 1985.
Miranda, L.R. et al., "Aerodynamic Effects of Wingtip-Mounted Propellers and Turbines," Amer. Inst. of Aeronautics and Astronautics No. 1986-1802, pp. 221-228.
Bilanin, A.J., "Integral Analysis of the Performance of a Wind Turbine in a Vortex Flow (Revision 1)," C.D.I. Report No. 88-03, Oct. 1988.
Bilanin, A.J., "Energy Recovery from Aircraft Wing Tip Vortices," C.D.I. Report No. 88-11, Nov. 1988.
Abeyounis, W.K., et al., "Wingtip Vortex Turbine Investigation for Vortex Energy Recovery," Aerotech '90, Oct. 1-4, 1990, Long Beach, CA (SAE Technical Paper Series, No. 901936).
Vatistas, G.H., et al., "A Simpler Model for Concentrated Vortices," Experiments in Fluids, vol. 11, pp. 73-76 (1991).
Johnson, W., "Technology Drivers in the Development of CAMRAD II," Amer. Helicopter Soc. Aeromechanics Specialists Conf., San Francisco, CA Jan. 19-21, 1994.
Roberts, A., "The Design and Experimental Optimization of a Wingtip Vortex Turbine for General Aviation Use," Thesis for Master of Science Degree in Aerospace Engrg., Embry-Riddle Aeronautical Univ., Apr. 1997.
Leishman, J.G., Principles of Helicopter Aerodynamics, 1st ed., Cambridge University Press (2000), pp. 435-440.
Teske, M.E., et al., "Drift Mitigation by Optimization of Wingtip Modification, Final Report," C.D.I. Report No. 01-03, Feb. 28, 2001.
Wachspress, D.A., et al., "Rotorcraft Interactional Aerodynamics with Fast Vortex/Fast Panel Methods," J. Amer. Helicopter Soc., Oct. 2003, pp. 223-235 (originally presented at 56th Annual Forum, Virginia Beach, VA, May 2-4, 2000).
Wachspress, D.A., et al., "First-Principles Free-Vortex Wake Analysis for Helicopters and Tiltrotors," presented at Amer. Helicopter Soc., 59th Annual Forum, Phoenix, AZ, May 6-8, 2003.
Moore, M.D., "Wake Vortex Wingtip-Turbine Powered Circulation Control High-Lift System," Circulation Control Workshop, Hampton, VA, Mar. 17, 2004, pp. 641-673.
Leishman, J.G., Principles of Helicopter Aerodynamics, 2nd ed., Cambridge University Press (2006), pp. 584-598.
Karimi, K.J., Future Aircraft Power Systems-Integration Challenges, Powerpoint presentationby Boeing Co., 2007.
Saberi, S., et al., "Overview of RCAS Capabilities, Validations, and Rotorcraft Applications," presented at Amer. Helicopter Soc., 71st Annual Forum, Virginia Beach, VA, May 5-7, 2015.
Whitehouse, G.R., et al., "Predicting the Influence of Blade Shape on Hover Performance with Comprehensive Analyses," J. of Aircraft, vol. 55, No. 1, Jan.-Feb. 2018, pp. 111-121.
Boschitsch, A.H., et al., "Aeroelastic Analysis Using Deforming Cartesian Grids," AIAA Journal, vol. 61, No. 3, Mar. 2023, pp. 1095-1108.
"Flying Wing," Wikipedia, https://en.wikipedia.org/, last visited Jan. 29, 2024.
"Blended Wing Body," Wikipedia, https://en.wikipedia.org/wiki/Blended_wing_body, last visited Feb. 13, 2024.

* cited by examiner

IDEALIZED TANGENTIAL (SWIRL) VELOCITY INSIDE A TIP VORTEX

METHOD OF CONFIGURING A WING-MOUNTED TURBINE FOR GENERATING ELECTRICITY AND INCREASING THRUST

CROSS-REFERENCE TO RELATED APPLICATION

This application claims the benefit of U.S. provisional application No. 63/445,515, filed Feb. 14, 2023, the entire contents of which are incorporated by reference as part of the present disclosure as if set out in full herein.

BACKGROUND

Onboard electrical power is widely used in commercial, military and general aviation, and in any other form of aircraft with electrical systems such as avionics, flight controls, external and onboard communications, cabin environmental control systems, and the like. The demand for onboard electrical power is expected to increase with the addition of more, and more complex, electrical systems capable of more advanced functionality. Aircraft with systems powered by electricity typically rely on self-contained auxiliary power units or generators driven directly by the aircraft's engines.

Commercial aircraft use electricity to provide passenger amenities such as internet access, cellular telephone service, and in-flight movies and television. As more such amenities are offered to passengers, the need for more onboard electrical power on commercial aircraft will likewise increase. Military aircraft also face increasing demands for onboard electrical power from evolving tactical, avionics and environmental control systems. Unmanned aerial vehicles ("drones") carry APUs or batteries for their onboard electrical requirements, including flight controls, communications with on-ground controllers, and avionics. Traditional ways of generating onboard electrical power carry a penalty of increased fuel consumption. Generating power diverted from the engine means requires added fuel to maintain the same propulsive force (thrust), and APUs run on fuel, all of which results in an increase in operating costs and carbon footprint, especially on a fleet-wide basis.

Some aircraft systems, like landing gear and control surfaces such as flaps, have traditionally used hydraulic actuators. Jet aircraft typically use hydraulic pumps powered by diverting ("bleeding") a certain amount of the air flowing through the engine to a turbine that drives the pumps. While this doesn't affect fuel consumption in the same way as using the engine drive shaft or an APU as a power source, it indirectly incurs a performance penalty. It reduces the mass flow of air through the engine, which reduces thrust, which in turn must be compensated for by burning more fuel. Boeing reports that its Model 787 realized a 20% increase in overall aircraft efficiency (in terms of fuel consumption and $CO_2$ emissions) by using electric hydraulic pumps as compared to the earlier Model 767 using bleed air.

Nor does meeting the demand for more electrical power appear to be a simple matter of diverting more power directly or indirectly from the engines, or generating more power using APUs, when adding electrical systems to existing aircraft. A final aircraft design accounts for myriad interrelated factors related to the aircraft's intended mission. These factors are finely balanced in the final design to achieve desired results in terms of efficiency, safety and performance throughout the aircraft's mission envelope. Alterations of one aspect of the design, especially one reducing the propulsive power available from the engines, can affect overall performance in unpredictable ways. It has been reported that adding additional electrically powered avionics and weapons systems to an existing F-35 fighter design resulted in performance penalties requiring extensive engine modifications.

Alternate sources of onboard electricity are being considered to reduce aviation's carbon footprint. Batteries are one possibility, but in spite of ongoing developments in battery technology, their low energy density compared to aviation fuel results in a power-to-weight ratio too low to make them a viable onboard source of electrical power for the foreseeable future. And in many applications, particularly in military and commercial aircraft, they will likely have to be recharged in flight by some manner of generating electricity. Long range powered flight relying solely on batteries also appears to still be over the horizon, as does relying on other carbon-free power sources such as fuel cells or non-carbon based fuels like hydrogen.

However, the wake of all aircraft contains a source of power going to waste on all known aircraft currently in service. FIG. 1 is a stylized depiction of known characteristics of the wake behind an airplane AC in level flight in a straight line at a constant freestream velocity $V_\infty$. The wake includes counter-rotating vortices $VO_R$ and $VO_L$ trailing the wingtips $WT_R$ and $WT_L$. For a substantial distance d behind the airplane, a flow field like that depicted at $d_f$ develops in a plane normal to the aircraft flight path, with a downdraft portion DW between the vortices and an updraft portion UW outboard of them. The lengths of the vectors in these portions represent the varying magnitude of the upward and downward velocity of the air in the wake behind the airplane. In a theoretical wing of infinite length, that is, without wingtips, the downwash velocity would be constant across the wake. But the vortex trailing the tip of a finite-length wing increases the downwash velocity closer to the wingtip, with a corresponding upward velocity outboard of the vortex. These aspects of aircraft aerodynamics are described in texts and throughout the literature, an example being Abeyounis, W. K., et al., "Wingtip Vortex Turbine Investigation for Vortex Energy Recovery," *AEROTECH* '90. Oct. 1-4, 1990, Long Beach, CA (SAE Technical Paper Series, No. 901936) ("Abeyounis"), from which FIG. 1 is taken. The vortices depicted schematically in FIG. 1 are known to form in reality, shown in the photograph of a Boeing 747 at https://www.airliners.net/photo/KLM-Royal-Dutch-Airlines-Cargo/Boeing-747-206BM-SF-SUD/239080.

Deleterious effects of wingtip vortices have also been long known. The airfoil AF in FIG. 2 illustrates one addressed here. An airfoil generates lift and drag directly proportional to the angle of attack $\alpha$ between the freestream velocity vector and the airfoil chord, defined as an imaginary straight line connecting the leading edge LE and the trailing edge TE. FIG. 2 illustrates the lift and drag forces at two angles of attack, one for a theoretical wing of infinite length (into and out of the paper) and another for a wing with the same airfoil AF but having a finite length, that is, with wingtips like the airplane AC in FIG. 1. The chord line $C_0$ represents the position of the theoretical, infinite-span wing in the airflow at an angle of attack $a_0$ relative to the freestream velocity vector $V_2$. This produces a normal force $L_0$ at the wing's center of gravity CG normal to the chord line $C_0$. As a result, $L_0$ has a vertical component $L_y$ ($=\cos \alpha_0$) and a horizontal component $D_0$ ($=\sin \alpha_0$). The angle of attack for any given wing must be great enough to produce a vertical lift component equal to aircraft weight WA. The horizontal component Do represents a baseline drag force opposite the direction of flight. These forces, including the baseline drag, are inherent properties of any wing with an angle of attack relative to an oncoming airflow.

However, the airflow surrounding real, finite-length, wings is affected by wingtip vortices like those depicted in FIG. 1. A theoretical infinite-length wing has no trailing vortices and the same lift $L_0$ along its entire span. The vortices produced by real wings alter the pressure distribution surrounding the wing in a way that decreases its effective angle of attack. As a result, the angle of attack of the wing must be increased to maintain the vertical lift component $L_y$ large enough to maintain the aircraft in flight. In FIG. 2 the increased angle of attack $\alpha_i$ resulting from altering the wing position is indicated by the solid chord line $C_i$. A value of $\alpha_i$ satisfying the relation $L_i = L_y/\cos(\alpha_0 + \alpha_i)$ provides the required additional lift $L_i$. At the same time, a penalty in the form of the force $D_i$ is added to the baseline drag $D_0$, making the total drag $D_T = D_0 + D_i = [L_0 \times \sin \alpha_0] + [L_i \times \sin(\alpha_0 + a_i)]$. The added induced drag represents lost energy that must be compensated for by increasing the propulsive power applied by the aircraft engines.

Currently, the aviation industry focuses primarily on reducing the kinetic energy represented by the mass flow in the vortex by altering the wing configuration in a manner that affects vortex formation and reduces induced drag. A common device for this purpose is a so-called "winglet" that extends the wingtip in a generally vertical direction to disrupt the fluid mixing caused by the difference in pressure of the air flowing between the top and bottom of the wing at the wingtip. An early description of this effect of winglets can be found in Whitcomb, R. T., "A Design Approach and Selected Wind-Tunnel Results at High Subsonic Speeds for Wing-Tip Mounted Winglets," *NASA Report No. NASA TN D-*8260. Langley Research Center, Langley, VA, July 1976. While winglets (Whitcomb calls them "vortex diffusers") and other known approaches to reducing the strength of trailing vortices and their deleterious effects dissipate some of the energy in the vortices, they do not capture any of it in the process.

SUMMARY OF THE DISCLOSURE

The possibility of using a small turbine near the tip of a wing to generate electricity by extracting energy from its trailing vortices has been explored in the literature. Patterson, J. C., Jr., et al., "Exploratory Wind-Tunnel Investigation of a Wingtip-Mounted Vortex Turbine for Vortex Energy Recovery," *NASA Report No. NASA TP*-2468. Langley Research Center, June 1985 ("Patterson"), reported data from tests on a model wing in a wind tunnel suggesting that it's possible both to reduce total drag and generate power by mounting a turbine behind the trailing edge at the tip of a wing. This was met with skepticism by some, but its sound theoretical basis was proven shortly after Patterson's paper in Bilanin, A. J., "Energy Recovery from Aircraft Wing Tip Vortices," *C.D.I. Report No.* 88-11, November 1988 (available from Continuum Dynamics, Inc., 34 Lexington Ave, Ewing Township, NJ 08618, www.continuumdynamics-.com) ("Bilanin"). The Abeyounis paper reported proof-of-concept tests on actual aircraft two years later. The entire contents of Patterson, Bilanin, A. J., and Abeyounis, are incorporated by reference as part of the present disclosure as if set out in full herein.

While theory and experimental results suggest that it's possible to have it both ways—reduce drag by adding thrust and generating power—it has yet to be confirmed as a practical matter. The Bilanin report explains the inherent inability of a turbine moving through still air to generate power in excess of the drag force on the turbine. A turbine moving through still air at a particular velocity generates power according to the formula:

$$P_{turb} = \left\{\left(\frac{1}{2}\right)\rho V_\infty^3 A\right\} Cp \tag{1}$$

where $P_{turb}$=the power extracted from the air by the turbine, $\rho$=the density of air, $V_\infty$=the airflow velocity, and A=projected area of the turbine disc ($2\pi R^2$; FIGS. 5-7). Cp is a parameter known as the power coefficient. It is a property of any particular turbine configuration and has a theoretical maximum of $^{16}\!/_{27}$, known as the Betz limit.

Bilanin points out that the force exerted on the turbine disc by the oncoming air (drag) is given by the formula:

$$F_D = \frac{8}{9}\left\{\left(\frac{1}{2}\right)\rho V_\infty^2 A\right\} \tag{2}$$

Thus, the maximum net power available from a turbine moving through still air, even one theoretically capable of operating at the Betz limit, is:

$$P_{net} = P_{turb} - F_D \times V_\infty \tag{3}$$
$$= -\frac{8}{27}\left\{\left(\frac{1}{2}\right)\rho V_\infty^3 A\right\}$$

The minus sign means that the turbine actually increases the drag on the aircraft and requires more power from the aircraft engines than it generates. Thus, simply mounting a turbine on an aircraft to generate electrical power is not the answer.

However, the Bilanin report also includes a rigorous mathematical proof that driving a turbine with the swirling flow in a vortex can generate more power without adding to the drag force (eq. 2). If certain properties of a theoretical vertical flow are assumed, Bilanin's solution yields a minus drag force on the turbine (that is, thrust), as seen in Bilanin FIGS. 7 and 8. Referring back to FIG. 2, thrust added by a turbine will counteract the induced drag $D_i$ resulting from the wingtip vortices. Thus, a turbine in the swirling flow field of a wingtip vortex can, at least in theory, convert the energy in the flow to thrust and reduce drag on the aircraft, and at the same time drive an electrical generator to power electrical subsystems on the aircraft.

What the prior art does not include is a systematic way of designing a turbine and determining the location at which to mount it on a specific aircraft that takes into account the configuration of the aircraft, the configuration of the turbine, and the turbines' effect on the aircraft as a whole. One object of the disclosure that follows is to confirm that actual turbine designs exist that can realize the advantages in reduced induced drag and increase in thrust heretofore suggested by prior theoretical means or by limited testing. Also disclosed is a method of identifying relevant parameters defining the configuration of an electricity-generating turbine and where to mount it on a specific aircraft to provide a desired combination of electrical power generation and added thrust.

BRIEF DESCRIPTION OF THE DRAWINGS

The objects of the invention will be better understood from the detailed description of its preferred embodiments which follows below, when taken in conjunction with the accompanying drawings, in which like numerals and letters refer to like features throughout. The following is a brief identification of the drawing figures used in the accompanying detailed description.

FIG. 6, comprising

One skilled in the art will readily understand that the drawings are not strictly to scale, but nevertheless will find them sufficient, when taken with the detailed descriptions of preferred embodiments that follow, to make and use the present invention.

DETAILED DESCRIPTION OF PREFERRED EMBODIMENTS

The detailed description that follows is intended to provide specific examples of particular embodiments illustrating various ways of implementing the claimed subject matter. It is written to take into account the level of knowledge of one of ordinary skill in the art to which the claimed subject matter pertains. Accordingly, certain details may be omitted as being unnecessary for enabling a person skilled in the art relating to the subjects disclosed here to realize the described embodiments. That person would have an advanced degree in mechanical or aerospace engineering, and would be familiar with advanced computer programs capable of applying mathematical algorithms for analyzing complex fluid flows, such as those based on blade element and lifting line theory, vortex lattice and panel methods, and three-dimensional computational fluid dynamics (CFD) programs. They would also be familiar with wind tunnel testing and analyzing and interpreting the results thereof.

In general, terms used throughout have the ordinary and customary meaning that would be ascribed to them by one of ordinary skill in the art. However, some of the terms used will be explicitly defined and that definition is meant to apply throughout. For example, the term "substantially" is sometimes used to indicate a degree of similarity of one property or parameter to another. This means that the properties or parameters are sufficiently similar in value to achieve the purpose ascribed to them in the context of the description accompanying the use of the term. Exact equivalence of many properties or parameters discussed herein is not possible because of factors such as engineering tolerances and normal variations in operating conditions, but such deviations from an exact identity still fall within the meaning herein of being "substantially" the same. Likewise, omission of the term "substantially" when equating two such properties or parameters does not imply that they are identical unless the context suggests otherwise. Similar considerations apply to the term "about," which is sometimes used to indicate that the nominal value of a parameter can vary a certain amount as long as it produces the intended effect or result.

Further, when elements are referred to as being "connected," they can be directly connected or coupled together or one or more intervening elements may also be present. In contrast, when elements are referred to as being "directly connected," there are no intervening elements present.

I. WING-MOUNTED TURBINE STRUCTURE

Figure 3:
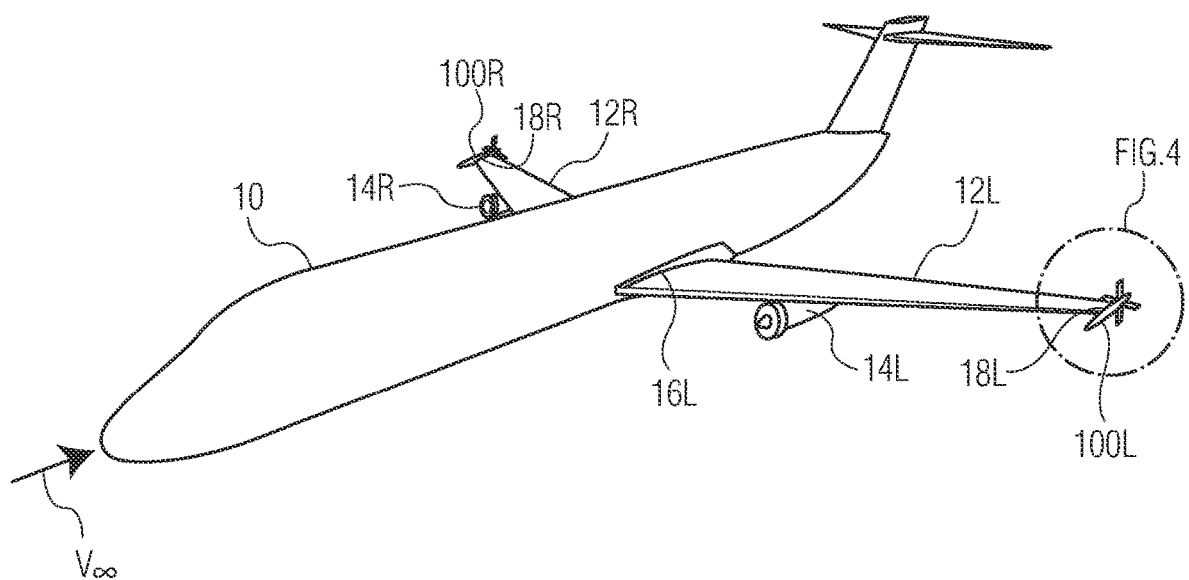
FIG. 3 depicts a typical transport aircraft including a preferred embodiment of the wing-mounted turbine described herein mounted to each wingtip.

FIG. 3 depicts a typical transport aircraft 10 for which the wing-mounted turbine of this disclosure will increase thrust and generate electricity for on-board equipment. The aircraft is shown in level flight at a constant freestream velocity $V_\infty$. The aircraft includes a left wing 12L and a right wing 12R. Turbofan engines 14L and 14R mounted to the respective wings 12L and 12R provide the main propulsive power to the aircraft. The wings will generate the trailing vortices depicted as $VO_L$ and $VO_R$ in FIG. 1. They are omitted from FIG. 3 for clarity of illustration. The wings' proximal ends 16 are attached to the aircraft at respective wing roots (only the left wing root 16L is visible in FIG. 3) with respective wingtips 18L and 18R at their distal ends. Wing-mounted turbines 100L and 1000R according to the present disclosure are mounted at the respective wingtips. By way of definition, the term "wing root" means the proximal end of each wing in aircraft such as that depicted in FIG. 3 having separate wings attached to a fuselage. It is also used in the context of a portion of the wing inboard of the wingtip without a well-defined proximal end per se. This would include aircraft where the proximal ends of the wings are attached to each other, as in so-called "flying wings." (See "Flying Wing," Wikipedia, https://en.wikipedia.org/Flying_wing: "A flying wing is an aeroplane that has no definite fuselage or tailplane, with its crew, payload, fuel, and equipment housed inside the main wing structure. A flying wing may have various small protuberances such as pods, nacelles, blisters, booms, or vertical stabilizers." It would also include "blended wing body" aircraft, in which the term "wingtip" would be understood in the context of the ends of the wings distal from the portion where they blend together with the fuselage. (See "Blended Wing Body," Wikipedia, https://en.wikipedia.org/wiki/Blended_wing_body: "A blended wing body (BWB), also known as blended body, hybrid wing body (HWB) or a lifting aerofoil fuselage, is a fixed-wing aircraft having no clear dividing line between the wings and the main body of the craft.")

Figure 1:
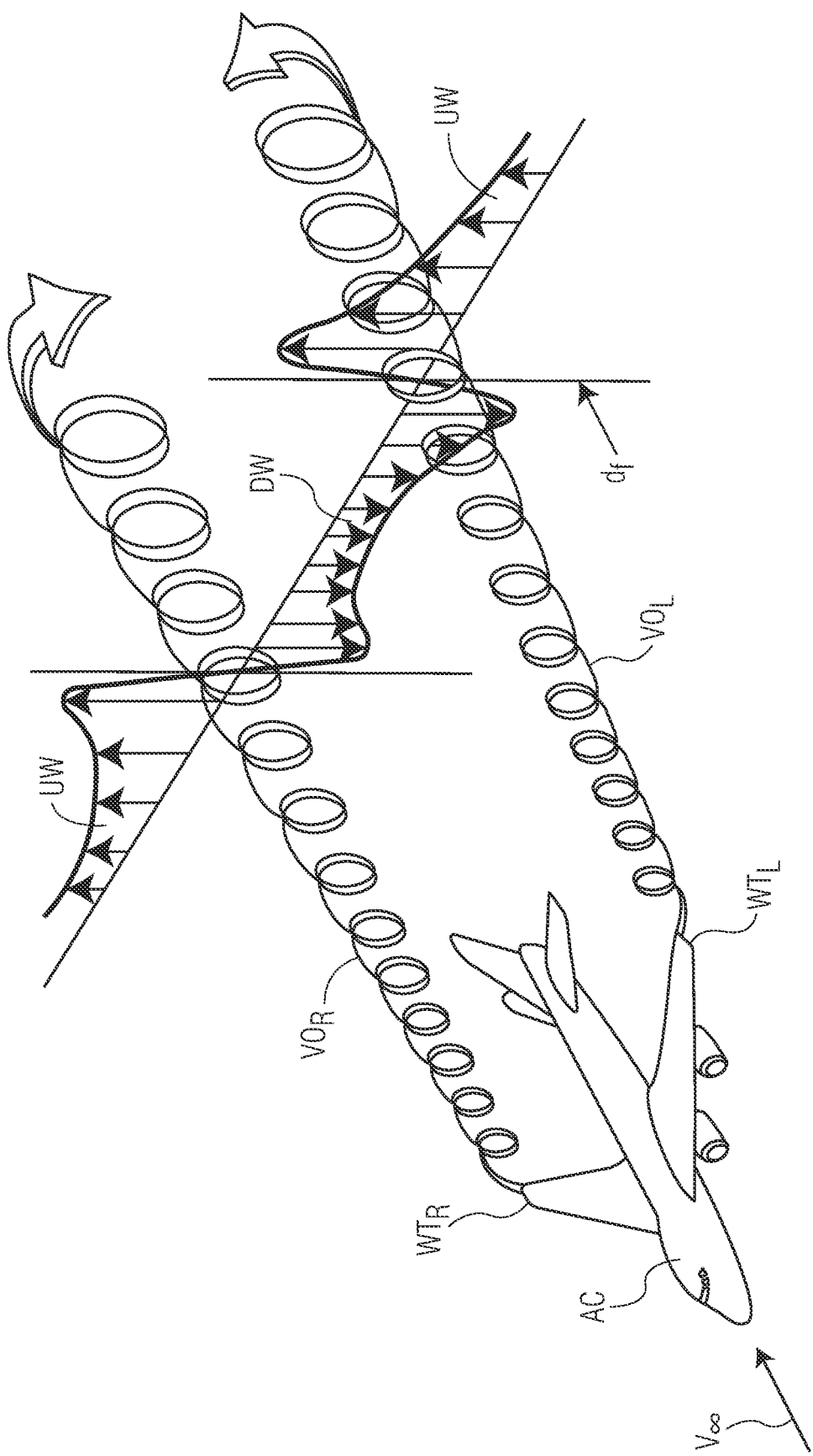
FIG. 1 is a stylized depiction counter rotating vortices $V_R$ and $V_L$ trailing the wingtips $WT_R$ and $WT_L$ of an airplane AC in level flight in a straight line at a constant velocity $V_\infty$.
Figure 2:
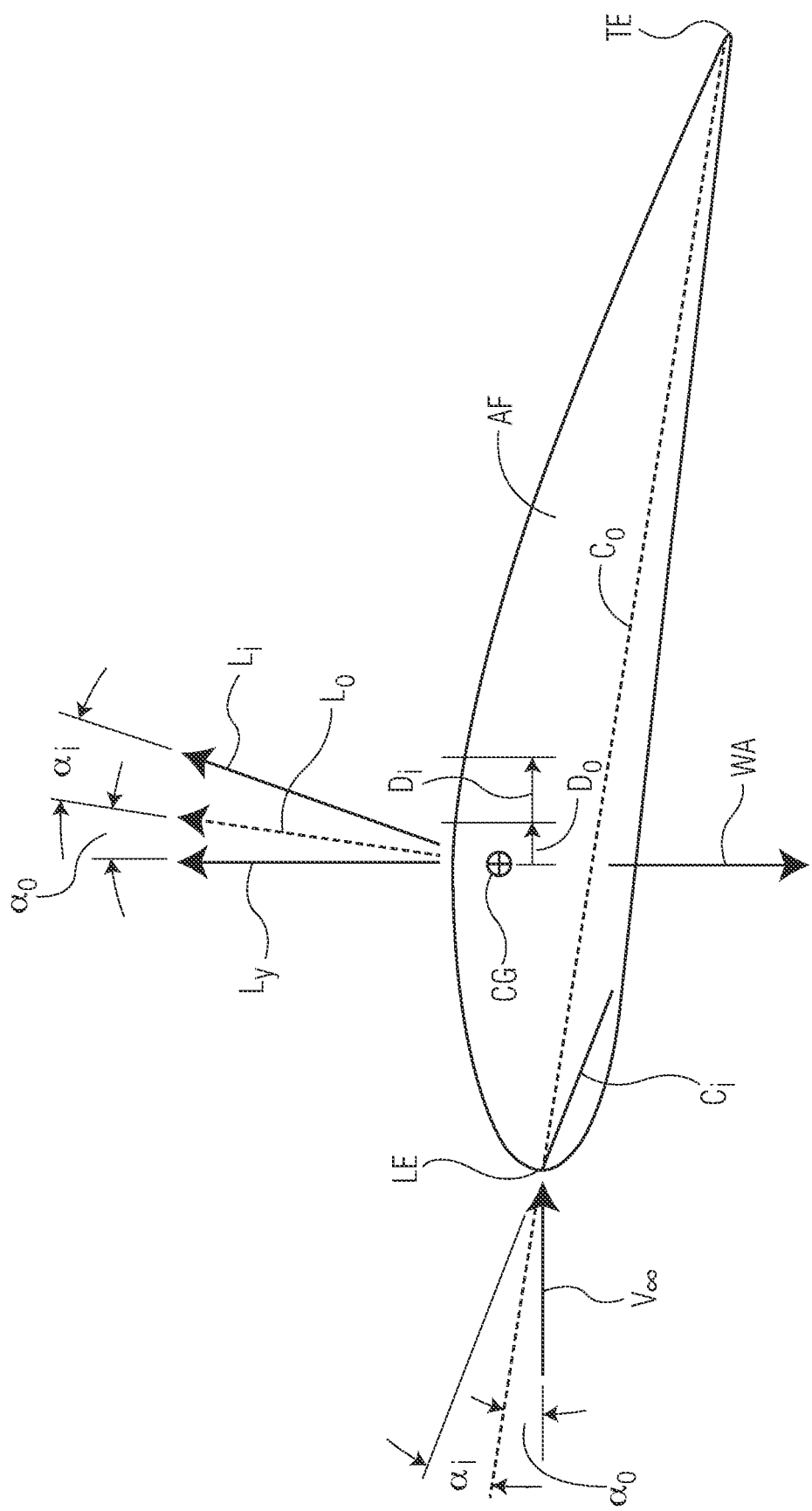
FIG. 2 illustrates the lift and drag forces on an airfoil AF at two angles of attack, one for a theoretical wing of infinite length and another for a wing with the same airfoil AF but having a finite length.
Figure 4:
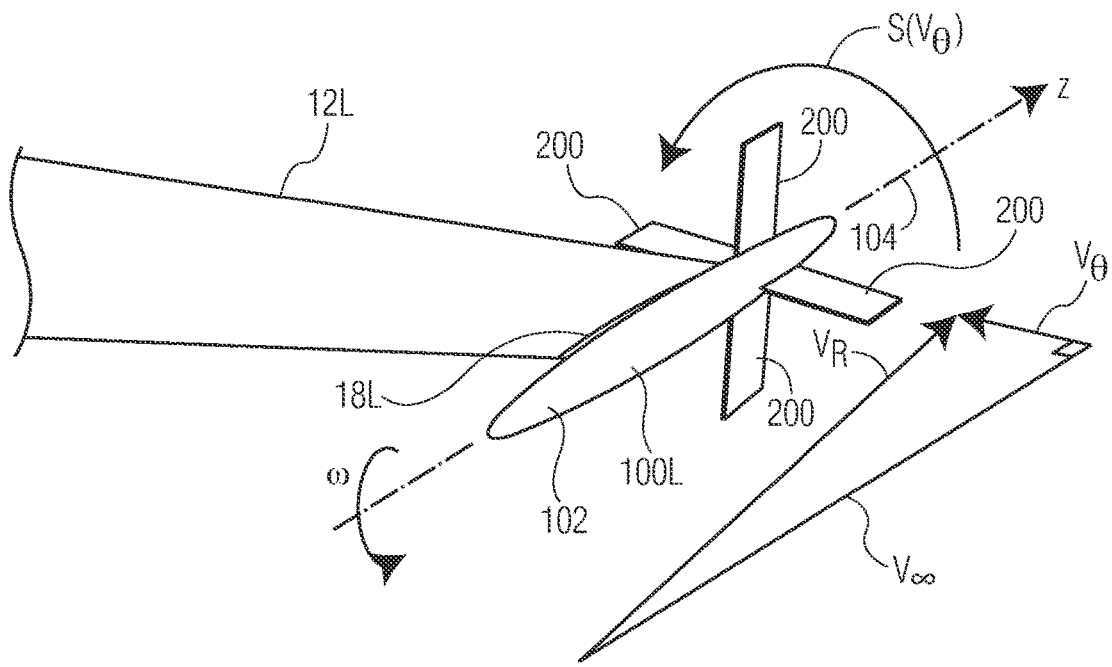
FIG. 4 is an enlarged oblique view of the tip region 4-4 of the left wing of the aircraft with the wing-mounted turbine shown in FIG. 3.

The aircraft 10 represents any heavier-than-air aircraft with wings that generate lift by virtue of having an airfoil-shaped cross-section like that in FIG. 2 and that trail vortices as shown in FIG. 1. The structure and methods described in the present disclosure can be applied to and used with commercial passenger aircraft, commercial transport aircraft, military aircraft, unmanned civilian and military aircraft (drones), small aircraft used in general aviation, etc. FIG. 4 includes an idealized representation of the rotational flow S in a vortex trailing the left wingtip 16L. The rotational flow S is the tangential component $V_\theta$ of the fluid velocity in the idealized vortex core, as discussed further below. The vector diagram associated with FIG. 4 illustrates how the vortex tangential flow $V_0$ at any given radial and circumferential location combines with the freestream flow $V_\infty$ to result in a velocity $V_R$ greater than the freestream velocity itself. Although the vectors are not to scale, since the tangential swirl velocity S may be much lower than the freestream velocity, the principle holds. Without the addition of the vortex's rotational flow S, the turbine would only generate electricity with a corresponding increase in the drag on the aircraft, as shown in equation (3).

Figure 5:
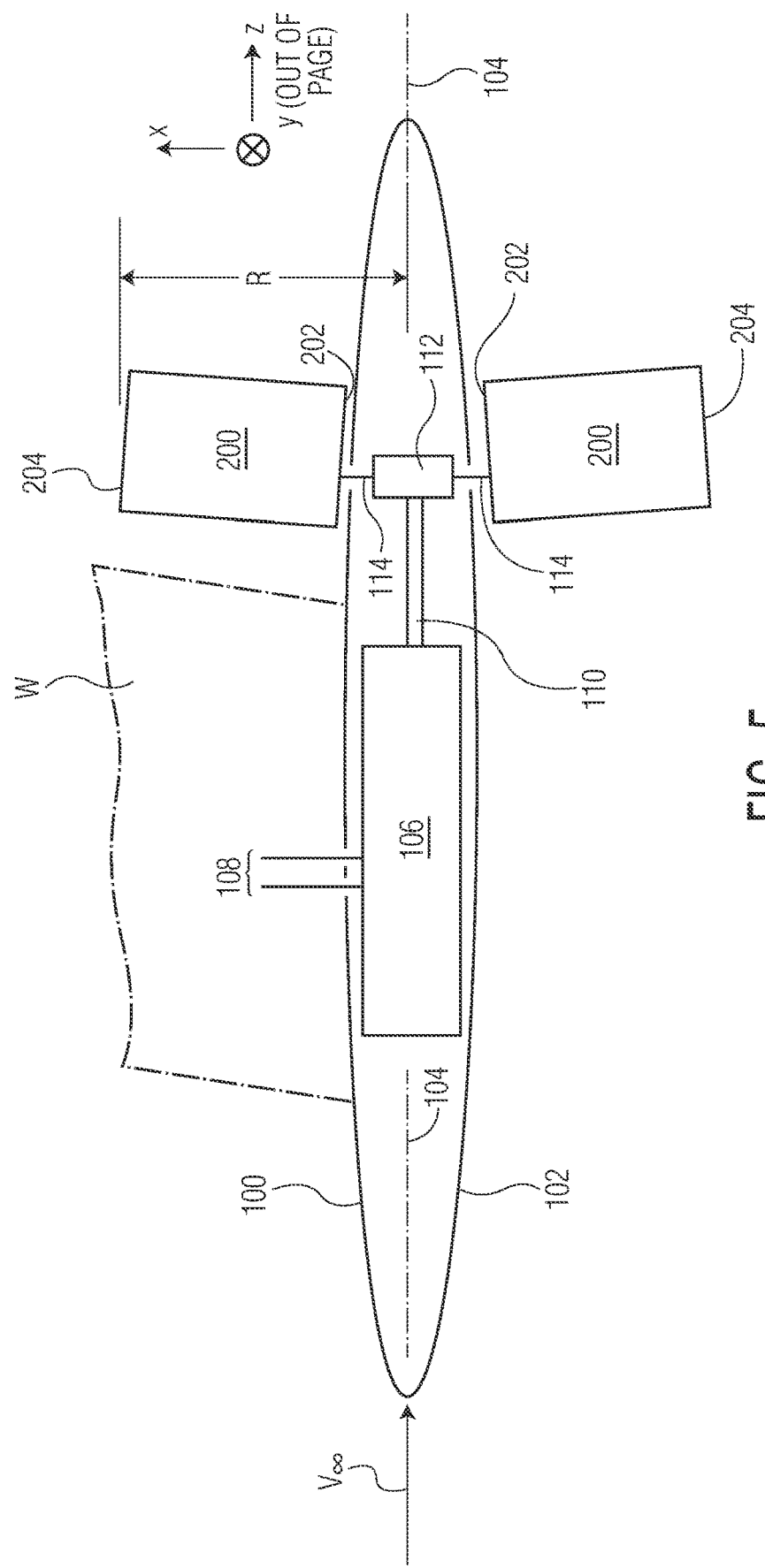
FIG. 5 is a schematic sectional view of generalized version of a wing-mounted turbine for use on an aircraft in the manner shown in FIGS. 3 and 4.

FIG. 5 is a detailed depiction of a preferred embodiment of a wing-mounted turbine 100 showing some of its principal geometrical parameters. In a preferred implementation, the turbine on each wing will typically be identical, except there will be right- and left-hand versions like 100R and 100L in FIG. 3. The description that follows applies to both versions, unless specifically stated or the context suggests otherwise. Various components shown in FIG. 5 are also called out in FIG. 4 for context, even though FIG. 5 is intended as a generalized version of a preferred turbine embodiment and FIG. 4 is, strictly speaking, a left-hand version. To orient the reader, the turbine 100 in FIG. 5 is shown mounted to a wing W. The view is taken from the top of the wing (looking down on FIGS. 3 and 4).

The turbine 100 includes a streamlined fairing 102 that is axisymmetric about a turbine rotational axis 104. The fairing mounts the turbine to an aircraft wing with the turbine shaft generally in the direction of the approaching freestream velocity $V_\infty$, although in some applications a final aircraft configuration designed in accordance with the protocols disclosed further below may result in slight deviations from that orientation. The fairing houses an electrical generator 106 and associated components, including electrical leads 108 disposed internally of the wing and directed to electrical subsystems on the aircraft A generator drive shaft 110 is connected to a hub 112, which is in turn connected by stub shafts 114 to the turbine blades 200. FIG. 4 illustrates a turbine with four blades, but the number of blades N in a final turbine configuration designed via the protocols to be discussed may dictate a different number. The blades rotate the turbine shaft 110 in the presence of the vortex flow trailing the aircraft wings to generate electricity delivered to the aircraft by the leads 108. The representation of the turbine blades in FIG. 5 is notional, intended to illustrate their general position in the turbine. The actual geometry of the turbine blade 200 used in the design protocols according to the present disclosure is defined by the parameters discussed next with reference to FIGS. 6 and 7.

Figure 6A:
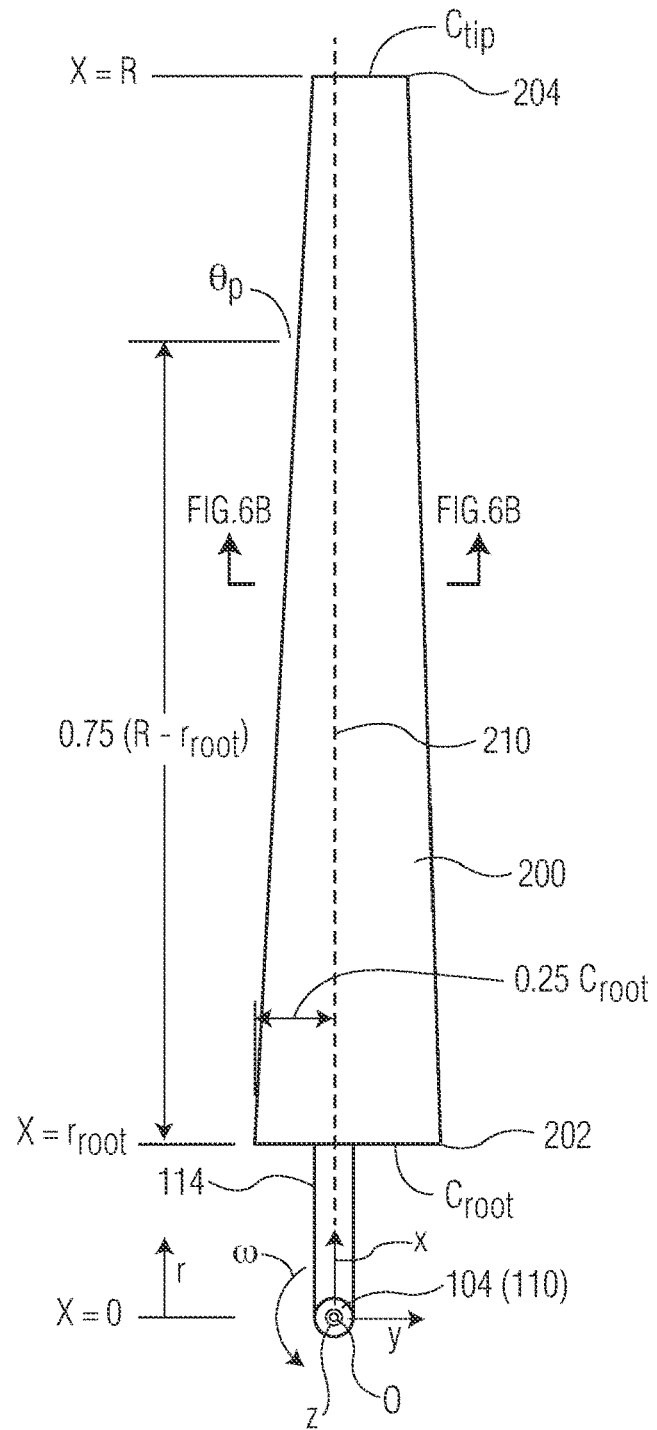
FIGS. 6A and 6B, depicts exemplary turbine blade metrics used in a preferred method of configuring a wing-mounted turbine as shown in FIG. 5, with FIG. 6A being a plan view of the turbine blade in the plane of rotation and FIG. 6B being an enlarged cross-section of the blade taken at the line 6B-6B in FIG. 6A.
Figure 6B:
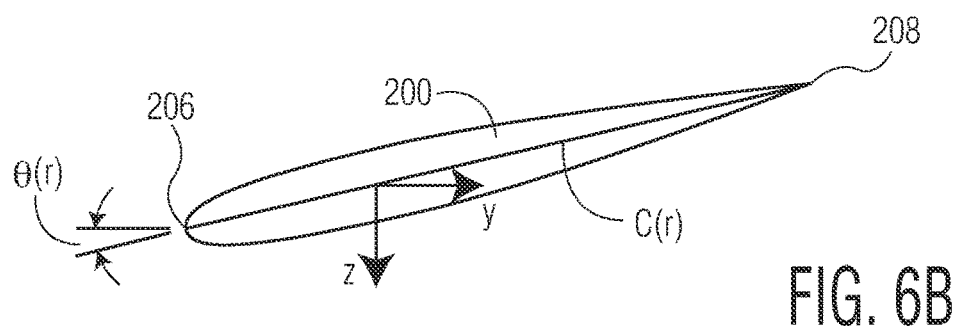

FIG. 6, comprising FIGS. 6A and 6B, defines the blade geometry with reference to a set of orthogonal axes {x,y,z} depicted in the figures. The design protocols discussed further below are employed to determine particular values of parameters shown in these figures that provide the turbine performance desired by an aircraft designer. Referring to FIGS. 5 and 6A, the blade 200 is attached by the stub shaft 114 to the turbine shaft 110 to rotate the blade about the turbine shaft 104. The turbine blades 200 extend between a blade root 202 and a blade tip 204. As shown particularly in the enlarged cross-sectional view in FIG. 6B, the blade has a lift-producing airfoil profile with a leading edge 206 and a trailing edge 208. The airfoil has a chord C defined as a straight line drawn between the leading and trailing edges.

Referring to FIG. 6A, the blade has a chord $C_{root}$ at the blade root 202 and a chord $C_{tip}$ at the blade tip 204. The blade root 202 is mounted to the stub shaft 114, as also shown in FIG. 5. The z-axis of the coordinate system is along the axis of rotation 104. The x-axis extends perpendicularly from the axis of rotation and, in the present embodiment, through the ¼ $C_{root}$ location. The blade can be mounted to the stub shaft 114 at other $C_{root}$ locations, although mounting it at the ¼ chord will typically place the stub shaft proximate to the center of the aerodynamic moment on the blade. The y-axis completes the right-hand coordinate system, and points generally in the direction of the blade trailing edge 208. (See FIG. 6B). The radial distance r from the rotational axis 104 is measured along the x-axis from the origin O (X=0). The blade root 202 is at $X=r_{root}$ and the blade tip is at X=R. (The coordinate axes are also depicted in FIG. 5 to assist in relating the figures to each other.) FIG. 6A depicts a blade with zero sweep, indicated by the ¼-chord line 210 substantially coinciding with the x-axis for the entire blade span $r_{root} \le X \le R$.

FIG. 6B illustrates three important blade parameters that can be designated by the design protocols described below. One is the chord length C as a function of the blade radius r, denoted as C(r) in FIG. 6B. The chord length typically decreases (blade taper) with increasing radius r. Blade taper most commonly decreases linearly, but C(r) can also be non-linear for certain applications. The next important parameter is the blade pitch angle θ as a function of the blade radius r, denoted as θ(r) in FIG. 6B. The pitch angle θ is the local angle between the chord C and the y-axis. The pitch angle will typically change (twist) with the radius r to account for the faster linear velocity of the rotating blade further from the turbine shaft. θ(r) will also usually be a linear function, although it can also vary nonlinearly and bi-linearly (different regions of linear twist) in some cases. In a typical design $\theta(r_{root}) > \theta(R)$. The third parameter is the nominal blade pitch $\theta_p$, comprising the blade pitch angle θ at a particular location along the blade span from $X=r_{root}$ to X=R. By convention, $\theta_p$ is typically taken at ¾ of the blade span, that is, at a distance $0.75 \times (R-r_{root})$ from the blade root 202. Blade pitch differs from blade twist: changing blade pitch involves rotating the entire blade bodily about the x-axis but doesn't change the blade's twist profile θ(r).

Figure 7:
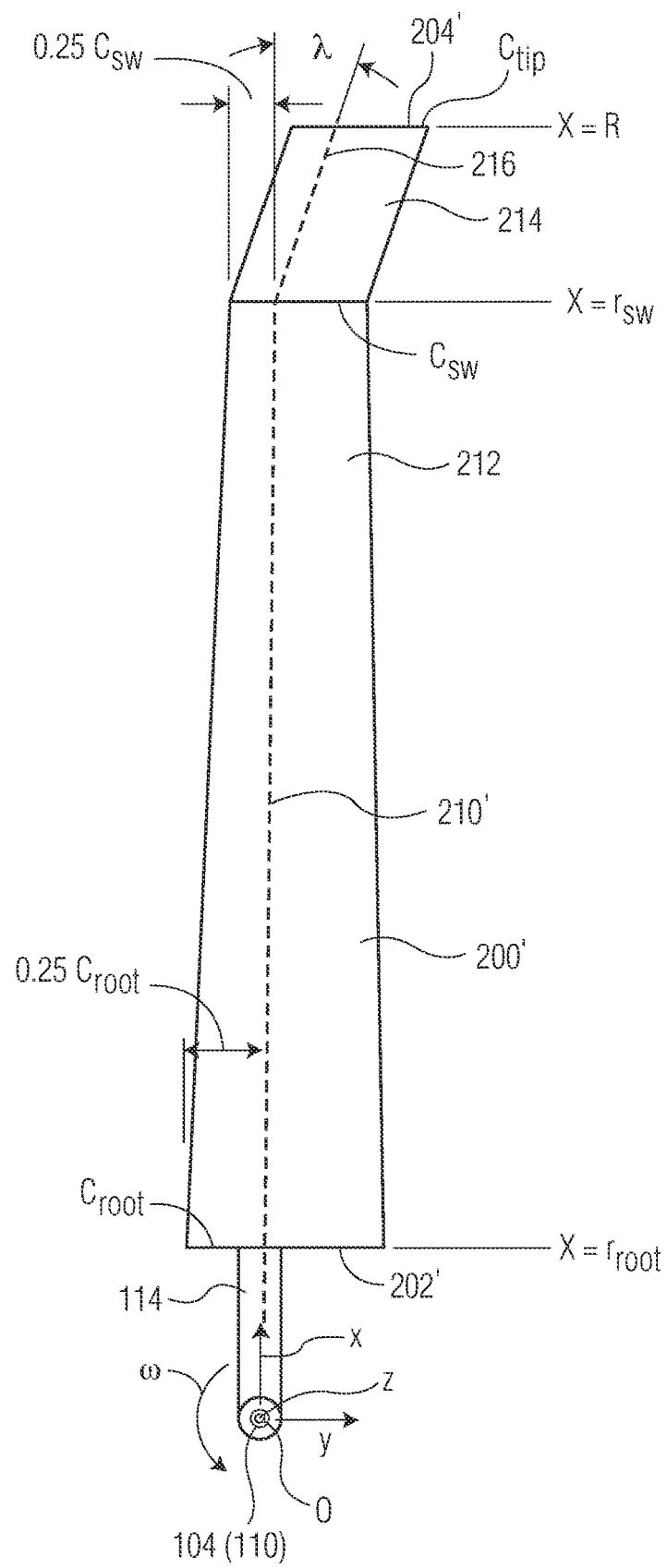
FIG. 7 depicts an alternate embodiment of the turbine blade in FIG. 6 illustrating an additional blade metric that can be determined by the methods described here.

In an alternate embodiment the turbine blades can be swept for all or a portion of the blade span, as illustrated by the blade 200' shown in FIG. 7. (Prime reference numerals indicate counterparts of features of the blade 200 in FIG. 6.) The blade 200' has a zero-sweep region 212, indicated by the ¼-chord line 210' lying along the x-axis, as in FIG. 6A. The blade has a swept region 214 from $X=r_{sw}$ to the blade tip 204' at X=R. The amount of blade sweep is quantified by the sweep angle A between the x-axis and the ¼-chord line 216 in the swept region 214. By convention, A is positive in the direction shown in FIG. 7 and is typically referred to as rearward sweep. Although FIG. 7 illustrates a blade swept in a tip region beginning at a distance from the blade root 202', the entire blade can be swept from $X=r_{root}$ to X=R. The blade sweep as a function of the blade radius, λ(r), is another blade parameter that can be designated by the design protocols described next Another blade parameter, not illustrated in the drawings, that can be designated is the anhedral angle φ of the blade chord line relative to the x-y plane, with a positive value indicating that the blade chord line deflects in the positive z-direction the x-y plane. The anhedral angle will typically be a nonlinear function of the blade radius φ(r), with the anhedral angle φ increasing in the +x direction.

II. DESIGNING THE WING-MOUNTED TURBINE

Figure 8:
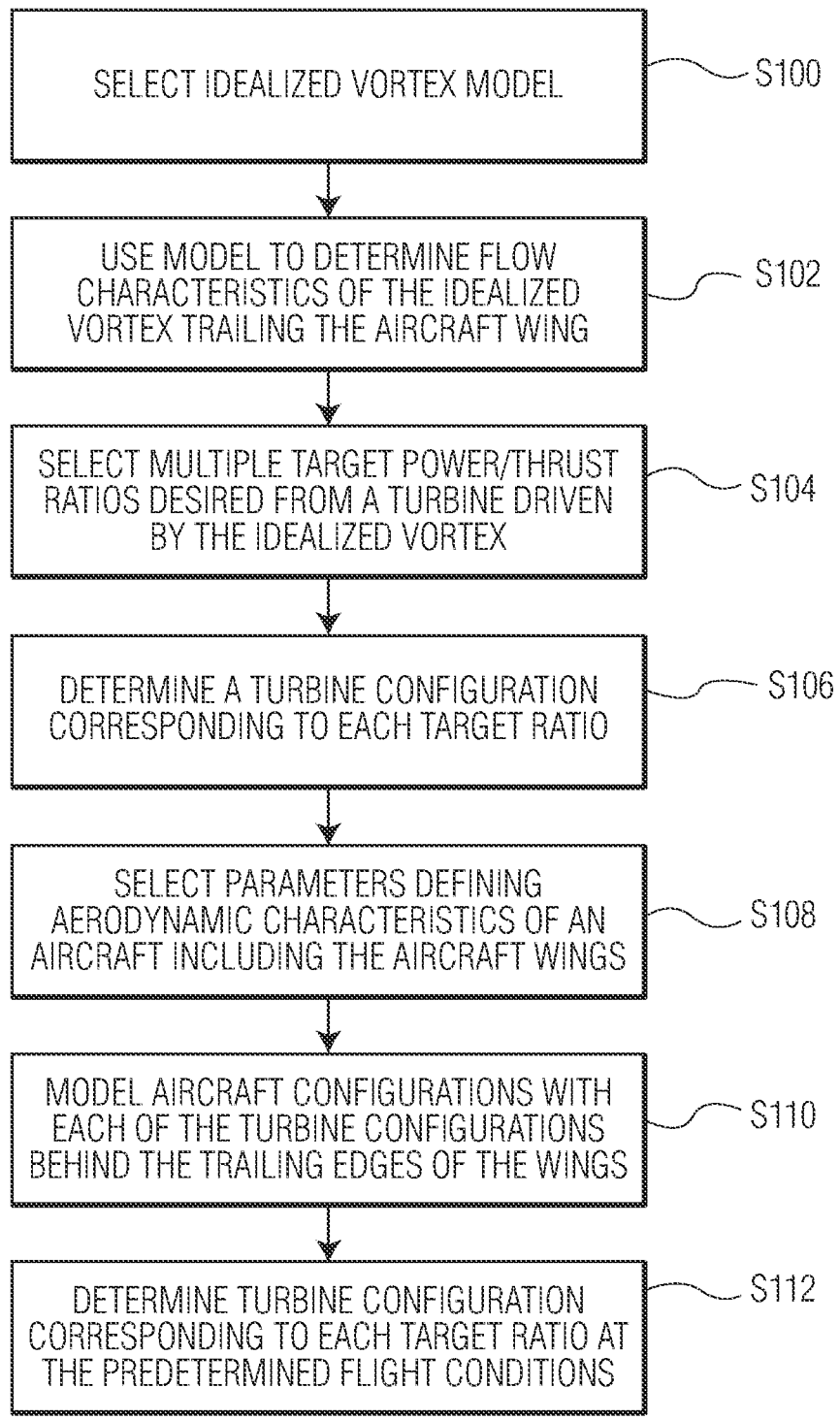
FIG. 8 is a flowchart of a method for configuring a wing-mounted turbine for an actual aircraft to reduce induced drag and generate electrical power in specified proportions.

Because there is a finite amount of energy in the trailing vortex flow, it will be advantageous to provide the aircraft designer a method of choosing the portion of that energy recovered as power and the portion recovered as added thrust to reduce aircraft drag. The designer will then be able to trade off the fuel savings from reducing the aircraft drag against the amount of electrical power available to supplement the power generated by known means (APUs, direct drive by the aircraft engines, bleed air, etc.). The flowchart of FIG. 8 depicts the steps in one embodiment of the method for configuring a turbine in accordance with certain aspects of the invention. For purposes of explaining the method, the steps of one preferred embodiment are described in the order shown in FIG. 8. However, the steps can be performed in any order unless otherwise stated or it is clear from the context.

A. Designing a Preliminary Idealized Turbine Configuration

The present embodiment of the method involves using an idealized vortex model to define a preliminary turbine configuration that will simplify determination of a final turbine configuration matched to the aerodynamic characteristics of an actual aircraft. The step S100 in FIG. 8 chooses an idealized vortex model, such as that depicted in FIG. 9 taken from FIG. 10.17 of Leishman, J. G., Principles of Helicopter Aerodynamics. $1^{st}$ ed., Cambridge University Press (2000), pages 435-440 ("Leishman I"), the contents of which are incorporated by reference as part of the present disclosure as if set out in full herein. An idealized vortex model is used to define a simplified version of a wingtip vortex that will be used to determine the preliminary turbine configuration. The preliminary turbine will then be matched to an actual aircraft to produce a final turbine configuration that provides the desired portion of the energy in the actual aircraft's trailing vortices recovered as power and the portion recovered as added thrust. This reduces the time that would be required to determine the final turbine configuration by modeling the aircraft/turbine combination at the outset because of the time consuming calculations required to solve the equations defining the complex actual flow structure trailing the wings in the presence of the turbine. The complexity of the swirling flow actually trailing a wing is shown in the photograph in FIG. 10.24 at page 596 of Leishman, J. G., Principles of Helicopter Aerodynamics. $2^{nd}$ ed., Cambridge University Press (2006) ("Leishman II").

Figure 9:
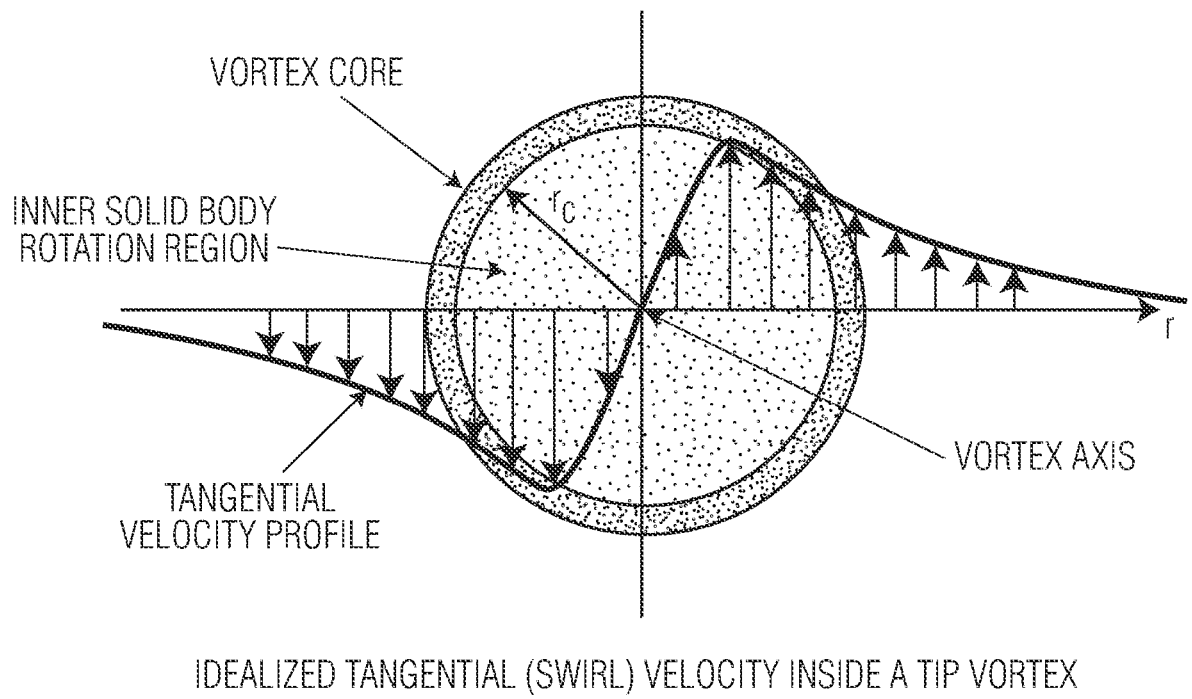
FIG. 9 depicts an idealized vortex model used according to a preferred design protocol for configuring an idealized version of the wing-mounted turbine depicted in FIG. 5.

The Leishman vortex model shown in FIG. 9 illustrates a vortex with an idealized vortex core in which the tangential flow velocity increases linearly with increasing radius from the vortex axis and reaches a maximum at a core radius $r_c$. (The tangential vortex velocity is referred to variously in this disclosure and in Leishman as "swirl velocity S," "tangential velocity," and $V_\theta$) The core radius $r_c$ is the distance from the vortex axis where the tangential velocity reaches a maximum, seen in the tangential velocity profile in FIG. 9. This region embodies most of the energy in the vortex, reflected by the rapidly decreasing tangential velocity outside the core. In a preferred embodiment, the step S100 uses the Rankine vortex model equations 10.5 in Leishman I and equations 10.8 in Leishman II to determine the tangential velocity profile as a function of the distance from the vortex axis to the radius of the vortex core $r_c$. The parameter $V_\theta(r)$, where $r_v$ is the radial distance from the core axis, is used to determine the preliminary turbine configuration in subsequent steps of the method. Pages 584-598 in Leishman II discussing the idealized vortex model and the equations used to calculate its flow characteristics are incorporated by reference as part of the present disclosure as if set out in full herein.

Other known vortex models can be found in Vatistas, G. H., et al., "A Simpler Model for Concentrated Vortices," *Experiments in Fluids*, vol. 11, pgs. 73-76 (1991); Scully, M. P., "Computation of Helicopter Rotor Wake Geometry and Its Influence on Rotor Harmonic Airloads," Massachusetts Institute of Technology Aerospace Structures Research Laboratory, Report ASRL TR 178-1, February 1975; and Johnson, W. J., "A Comprehensive Analytical Model of Rotorcraft Aerodynamics and Dynamics," NASA Report TM-81182, June 1980. The descriptions of vortex models in these publications are incorporated by reference as part of the present disclosure as if set out in full herein.

The next step S102 determines the actual function $V_\theta(r_v)$ to use in subsequent steps based on the aircraft for which the turbine is being designed. In the Rankine vortex model in Leishman, vortex strength F ("circulation") and the core radius $r_c$ determine $V_\theta(r_v)$ for any given application, per the following equation taken from Leishman:

$$V_\theta(\bar{r}) = \left(\frac{\Gamma_v}{2\pi r_c}\right)\bar{r}_c, \text{ for } 0 \leq \bar{r} \leq 1 \qquad (4)$$

$$V_\theta(\bar{r}) = \left(\frac{\Gamma_v}{2\pi r_c}\right)\frac{1}{\bar{r}_c}, \text{ for } \bar{r} \geq 1$$

where $\bar{r}$ is $r_v/r_c$ and $\Gamma_v$ is the circulation in the vortex. Recall that $V_\theta=0$ at the vortex axis and by definition has a maximum value $V_{\theta max}$ at the core radius $r_c$. Thus, if the core radius $r_c$ and peak velocity $V_{\theta max}$ of a particular vortex are known, then $$V_\theta(r_v) = \frac{V_{\theta max}}{r_c} \times r_v$$

for $r_v \leq 1$ and $V_{\theta max}/r_c \times 1/r_v$ for $r_v > 1$. The following paragraphs describe some of the ways the Rankine vortex model provides to determine $V_\theta(r_v)$ for a particular target aircraft for which the turbine is intended. Other idealized vortex models such as those described above can be used to the same purpose.

In some instances, values of $r_c$ and $V_{\theta max}$ are available in the literature or can be specified based on a curve fit to experimental data. A description of one way to determine $r_c$ and $V_{\theta max}$ based on measurements of the wake of an actual aircraft in flight is set out at pages 27-41 of Burnham, D. C., "B-747 Vortex Alleviation Flight Tests: Ground Based Sensor Measurements," DOT-FAA-RD-81-99, February 1982, which are incorporated by reference as part of the present disclosure as if set out in full herein. By fitting a curve of the wingtip vortex velocity to measurements taken in the wake, Burnham determined that the peak vortex velocity of 16 m/sec ($V_{\theta max}$) occurred at a vortex radius of 2.51 m ($r_c$), Burnham, page C-2, making $$V_\theta(r_v) = \frac{16}{2.51} \times r_v$$

for $r_v \leq 1$ and $$\frac{16}{2.51} \times \frac{1}{r_v}$$

for $r_v > 1$ if a Rankine model is assumed.

In some cases the manufacturer of the target aircraft or similar model will have the necessary data on hand. If not, measurements can be taken of the aircraft in flight and a similar analysis to that used in Burnham can be used to determine the equation to use for $V_\theta(r_v)$. Wind tunnel tests on an aircraft wing simulating that of the actual aircraft can also be used in place of measurements taken in flight Or, in another alternative, the results in Burnham can be scaled by a factor based on the aircraft dimensions and flight conditions (speed and weight) as compared to the Boeing 747 test results in Burnham. A computational fluid dynamics (CFD) program could also be used to determine from a mathematical model of the aircraft's wing values for $V_{\theta max}$ and $r_c$ to use in the model. Those skilled in the art will be familiar with a wide variety of commercially available CFD programs suitable to the purpose.

Another way of determining $V_\theta(r_v)$ first calculates a value of f to use in the Rankine model in Leishman. For example, F for a theoretical elliptically loaded wing is given by the following equation:

$$\Gamma = 4 \times L(\pi \times \rho \times V_\infty \times b) \quad (5)$$

where L is the lift to be generated by the wing (one-half the aircraft weight W for each wing), $\rho$=the density of the air at the chosen flight condition, $V_\infty$=the freestream velocity at the chosen flight condition, and b=wingspan (the distance between the midchord at the wing root 16 and the midchord at the wingtip 18). A typical application of this method uses the flight conditions in level flight at the aircraft's design cruise velocity and altitude since that condition will occupy most of the aircraft's mission envelope. In addition, it will usually maximize the concomitant benefits from a given electrical power/reduced drag ratio provided by the turbine. However, the method can use any flight condition as a design point depending on the goal of adding the turbine to the aircraft. In addition, equation (5) represents the loading for a theoretical elliptically loaded wing, but other wing loading distributions may be used, such as the actual wing loading of the target aircraft for a selected flight condition.

The other variable in equation (4) needed to determine $V_\theta(r_v)$ is the core radius $r_c$. For example, the aerodynamics can be predicted by classical vortex theory or by a CFD calculation. Knowing the properties of the wake trailing the wing and how it rolls up into the vortices will enable $r_c$ for a given wing geometry and flight condition to be determined. Alternatively, if test data or experimental results are available, $r_c$ can be approximated by scaling in according to aircraft size. For example, $r_c$ for an aircraft ¼ the size of a Boeing 747 would be 0.625 m (=0.25×2.5 m).

Figure 10:
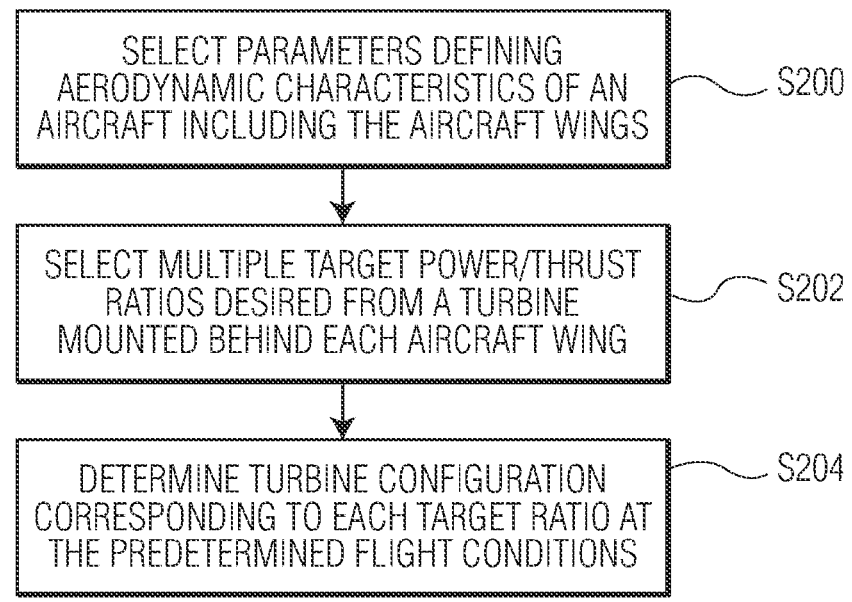
FIG. 10 is a flowchart of an alternate method for configuring a wing-mounted turbine for an actual aircraft to reduce induced drag and generate electrical power in specified proportions.

In an alternate embodiment the axial velocity profile $V_z(r_v)$ of the idealized vortex can be used with the swirl velocity radial profile $V_\theta(r_v)$ in modeling the preliminary turbine configuration. The portions of Leishman I and Leishman II incorporated by reference discuss multiple ways to determine $V_z(r_v)$ known to correlate well with experimental data, as shown in FIG. 10.19(b) of Leishman I (repeated as FIG. 10.21(b) of Leishman II).

In step S104 the aircraft designer selects one or more target values for a weighted combination of power to thrust to be recovered from the vortices trailing the wings of the aircraft AC. For example, the aircraft to be modified with the added turbines may require a large amount of electrical power, and the designer may want to weight the capability of the turbine configuration towards generating more power. Thus, the designer may want a turbine configuration in which the total available energy in the idealized trailing vortex is proportioned to generate 80% power and 20% added thrust. Then, for comparison purposes, the designer may want to calculate respective turbine configurations that will provide a 70/30 proportion and a 90/10 proportion. There is no limit to the number of power/thrust weighted combinations that can be used in the method. In addition, the designer could specify a weighted combination whereby the power is maximized without adding drag (power/thrust=100/0), or the thrust is maximized without generating electricity (power/thrust=0/100).

Step S106 results in an optimized preliminary turbine configuration corresponding to one or more of the target power/thrust ratios selected in step S104. An aircraft designer first selects the turbine parameter values to be determined that will meet the desired design criteria. In the present preferred embodiment, the turbine parameters include the blade twist $\theta(r)$, chord length $C(r)$, blade sweep $\lambda(r)$, blade pitch $\theta_p$, turbine radius R at the turbine inlet, number of blades N, and turbine rotation rate w. Additional parameters such anhedral profile $\varphi(r)$, can also be included. The following working example illustrates how an optimized preliminary turbine configuration is created from these parameters.

The aircraft designer will first select a set of the parameters as target parameters for an optimization routine. In the present example, these include chord length $C(r)$, blade sweep $\lambda(r)$, turbine radius R, and number of blades N. (The blade in the present example will be designed without anhedral.) The designer also designates a control parameter that the optimization routine will use to generate values of other turbine parameters defining the optimized preliminary turbine configuration. The present example uses blade twist $\theta(r)$ as the control parameter since it generally influences turbine performance more than the other parameters defining the blade geometry. Of the remaining turbine parameters blade pitch $\theta_p$ and rotation rate w, one is kept constant as a fixed parameter and the other is treated as a target parameter during a first phase of the optimization routine. In this working example, only one turbine parameter has a fixed value, but alternate approaches can use multiple fixed parameters. The designer designates starting values for all of the turbine parameters (chord length $C(r)$, blade sweep $\lambda(r)$, turbine radius R, number of blades N, blade twist $\theta(r)$, blade pitch $\theta_p$, and rotation rate $\omega$). A person knowledgeable in turbomachinery design would be able to select appropriate starting values for these parameters; reference can be made to wingtip turbines described in the literature for further guidance. For example, the parameters of the turbine tested by Abeyounis can be used as reasonable starting values for corresponding parameters used here.

The designer also designates a target turbine output for the desired weighted combination of power to thrust. The present example seeks to produce a weighted combination that comprises the maximum available thrust and power in equal proportions. The designer will set a value of power or thrust to be used by the computer program as a minimum to be attained by the turbine. This will act as a further constraint on the optimization routine described in the next paragraphs. In other words, the end result will be a preliminary turbine configuration that provides at least the specified minimum power or thrust. This example uses the minimum thrust as a constraint on the optimization routine.

The designer also specifies further constraints on the turbine design variables, such as minimum and maximum values for the chord length, blade twist, blade sweep, turbine radius, rotation rate and number of blades. The designer will recognize certain constraints on all of the design variables relating to geometric and aerodynamic considerations. For example, the rotation rate will be constrained within a range where the tip speed is below a supersonic velocity, while still being fast enough to have a Reynolds number providing reasonable aerodynamic performance. The designer also selects which output variable (thrust or power)—or, alternatively, what weighted combination of the two—is to be maximized as the target turbine parameters are altered during the optimization routine. In the present example, the program will be asked to determine values of the target parameters producing maximum power and thrust in equal amounts.

The optimization routine comprises a recursive process that initially determines changes to the starting values of the selected target parameters required to meet the specified target output using the specified starting target parameter values with blades having the specified starting value of the control parameter $\theta(r)$. In succeeding steps, the program makes an incremental change in $\theta(r)$ and calculates any changes required to the target variables from the previous step to meet the designated target output (while still maintaining the thrust above the specified minimum value). The routine continues until the designer's target 50/50 weighted combination with maximized thrust and power is met or until further changes in the blade twist distribution $\theta(r)$ result in changes to the set of target parameters that yield little or no improvement in the equal amounts of power and thrust produced by the previous set.

The routine will typically employ a set of user constraints that limit the amounts by which the chosen target parameters change during each step. Appropriate constraints will also be placed on the changes to $\theta(r)$ during each step, such as limiting the amount by which it can change for a given portion along the blade and limiting the maximum total blade twist to a reasonable value (say 50°). These constraints on the levels of change are chosen so the program will make steadily progressive improvements in the selected target weighted combination and will not reach a point in the specified range of targeted parameters where further optimization becomes infeasible, for example, by identifying a blade geometry impractical to manufacture.

The result is a preliminary turbine configuration defined by the end value of the control parameter $\theta(r)$, the optimized target parameters, and the fixed blade pitch parameter $\theta_p$ that will achieve the maximum value of the desired 50/50 weighted combination of thrust and power. The optimization process can be repeated one or more times to compare the values of thrust and power obtained with different constraints and/or starting values. It can also be repeated for different weighted combinations of power to thrust that might better match the aircraft designer's performance goals. To the same end, the designer can run the program with different fixed values of blade pitch, or with a different or more than one fixed turbine parameter. In addition, the entire routine could be re-done for each of the other design variables, such as chord length C(r), blade sweep $\lambda$(r), anhedral angle $\varphi$(r), turbine radius R, or number of blades N, either keeping the other parameters constant or while allowing all of them to change at the same time.

There are a number of commercially available computer programs at the designer's disposal to perform the described optimization routine determining an idealized preliminary turbine configuration in accordance with this disclosure. These are some examples:

EHPIC/HERO (Evaluation of Hover Performance using Influence Coefficients/HElicopter Rotor Optimization), available from Continuum Dynamics, Inc., at https://continuum-dynamics.com/old/pr-ehpic.html. Additional information on EPHIC and how to use it for the present purpose can be found in Whitehouse, G. R., et al., "Predicting the Influence of Blade Shape on Hover Performance with Comprehensive Analyses," J. of Aircraft, vol. 55, no. 1, January-February, 2018, pages 111-121 ("Whitehouse"), the entire contents of which are incorporated by reference as part of the present disclosure as if set out in full herein.

CHARM (Comprehensive Hierarchical Aeromechanics Rotorcraft Model), available from Continuum Dynamics, Inc., at https://continuum-dynamics.com/product/#charm and at https://continuum-dynamics.com/old/pr-charm.html. Additional information on CHARM and how to use it for the present purpose can be found in Whitehouse and in Wachspress, D. A., et al., "Rotorcraft Interactional Aerodynamics with FastVortex/Fast Panel Methods," J. Amer. Helicopter Soc., October 2003, pages 223-235 (originally presented at 56th Annual Forum, Virginia Beach, VA, May 2-4, 2000), the entire contents of which are incorporated by reference as part of the present disclosure as if set out in full herein.

VTM (Vorticity Transport Model), available from Continuum Dynamics, Inc., at https://www.continuum-dynamics.com/old/pr-vtm.html. Additional information on VTM and how to use it for the present purpose can be found in Whitehouse.

CGE (Cartesian Grid Euler Solver), available from Continuum Dynamics, Inc., at https://www.continuum-dynamics.com/old/pr-cge.html. Additional information on VTM and how to use it for the present purpose can be found in Whitehouse and in Boschitsch, A. H., et al., "Aeroelastic Analysis Using Deforming Cartesian Grids," AIAA Journal, vol. 61, no. 3, March 2023, pages 1095-1108, the entire contents of which are incorporated by reference as part of the present disclosure as if set out in full herein.

GRCAS (Graphical Rotorcraft Comprehensive Analysis System), available from Advanced Rotorcraft Technology, Inc., 46757 Fremont Blvd, Fremont, CA 94538, at https://www.flightlab.com/grcas.html. Additional information on GRCAS and how to use it for the present purpose can be found in Saberi, S., et al., "Overview of RCAS Capabilities, Validations, and Rotorcraft Applications," presented at Amer. Helicopter Soc., 71st Annual Forum, Virginia Beach, VA, May 5-7, 2015, the entire contents of which are incorporated by reference as part of the present disclosure as if set out in full herein. (GRCAS is a commercial version of RCAS, which is a U.S. government code).

CAMRAD II, available from Analytical Methods, Inc., 2133-152nd Avenue NE, Redmond, WA 98052, at https://www.am-inc.com/CAMRAD.html. Additional information on GRCAS and how to use it for the present purpose can be found in Johnson, W., "Technology Drivers in the Development of CAMRAD II," Amer. Helicopter Soc. Aeromechanics Specialists Conf., San Francisco, CA Jan. 19-21, 1994, the entire contents of which are incorporated by reference as part of the present disclosure as if set out in full herein.

A preferred version of the disclosed optimization routine uses the EHPIC program because it is less computationally intensive and will take significantly less time to complete the necessary calculations. This is because EHPIC assumes azimuthal symmetry in its flow solution, making it particularly applicable to a turbine driven by the purely axial flow of an idealized vortex model. This aspect of EHPIC greatly reduces the degrees of freedom in the flow solution and permits rapid convergence to a solution of the complex equations defining a swirling flow through a turbine. This is an important feature of the present embodiment because it shortens the time required to determine the optimum configuration of a turbine matched to a particular aircraft as described in the next section. However, any of the listed programs can perform the same function as EHPIC in this method step by assuming the same azimuthal flow symmetry. More information about computer programs useful in the methods described here can be found in Johnson, W., "A Comprehensive Analytical Model of Rotorcraft Aerodynamics and Dynamics," NASA Technical Memorandum 81182, June 1980.

B. Matching the Preliminary Turbine Configuration to an Actual Aircraft

The next steps continue the present embodiment of the design process by matching the preliminary turbine configuration to the actual aircraft AC. That is, the preliminary turbine design resulting from the steps S100-S106 is based on a highly idealized vortex model. However, as noted before, wingtip vortices from an actual aircraft are much more complex, which will inevitably affect the final aircraft/turbine combination. For example, it may require the turbine to be positioned at a location behind the wing trailing edge at a location other than at the wingtip in order to achieve any of the specified power/thrust ratios.

The step S108 begins a part of the disclosed method in which the preliminary turbine configuration, based on an idealized vortex model, is matched to the actual aircraft under consideration. In the present embodiment, the turbine is to be retrofit to an existing aircraft such as the aircraft AC to generate electricity and/or increase thrust (reduce induced drag) in a desired proportion. This first requires selecting parameters defining principal aerodynamic characteristics of the aircraft. This will typically include lift, wingspan, velocity, density of the air, wing chord distribution (chord length as a function of the distance from the wing root), sweep angle (the angle between the freestream velocity vector and the wing leading edge), and the wing angle of attack $\alpha$ at the flight conditions of interest (e.g., level flight at constant cruise altitude and airspeed). The designer can also include aircraft flow characteristics attributable to the fuselage geometry if desired.

In step S110 the aircraft is modeled multiple times, with each model corresponding to one of the preliminary, idealized turbine configurations with different weighted combinations determined in the step S106. That is, for each model an aircraft configuration reflecting the selected aircraft aerodynamic characteristics is combined with one of the turbine configuration determined in the step S106 to simulate an aircraft/turbine combination. A preferred embodiment of each preliminary turbine used in this step will include the number of turbine blades N, the turbine radius R at the turbine inlet, the blade pitch $\theta_p$, the blade pitch angle as a function of the blade radius (blade twist $\theta(r)$), the chord length as a function of the blade radius (blade taper $C(r)$), and the turbine rotation rate $\omega$. As discussed in the preceding section, other parameters can be used to define the preliminary turbine configuration, such as blade sweep $\lambda(r)$ and anhedral $\varphi(r)$.

In the step S112 the simulated aircraft/turbine combination is used to calculate the thrust-to-electricity ratios associated with the corresponding idealized turbine constructions at the same flight conditions. This step will preferably use one of the more computationally intensive computer programs identified above, such as one capable of a computational fluid dynamics (CFD) analysis or a similar approach. The listed CHARM program is particularly suited to the purpose but others of those listed can also do the necessary computations.

The resulting thrust-to-power ratio in the weighted combination may differ from the ratios produced by the preliminary turbines because the preliminary turbine configurations were based on the idealized vortex model rather than the flow calculated using the aircraft/turbine combination. In that case various optimization procedures are employed to determine a final turbine configuration meeting the aircraft designer's requirements. A preferred procedure will examine the results obtained using different values for blade pitch ep, since it will likely be the most outcome-determinative blade parameter. However, different values for any of the blade parameters among those described above can be examined, either alone or in combination, across a range of values to identify the turbine configuration most suited to the aircraft's mission. This analysis will preferably include a determination of the thrust-to-power ratio for one or more of the turbine configurations in various flight conditions other than level cruise at a constant altitude and airspeed. In addition, the turbine can be modeled with variable-pitch blades and the effect of different blade pitches at different flight conditions can be determined.

The effect on the thrust-to-power ratio of other factors can be determined depending on the capabilities of the computer program used in this step. For example, the ratio may be affected by unsteady loading effects caused by the periodic disruption of the flow through the turbine as the blades pass the trailing edge of the wing. This will permit calculation of any long-term fatigue issues that the turbine and/or aircraft may experience as a result. It will also allow production of an acoustic profile that can affect compliance with noise regulations. An additional example of an optimization routine will predict the overall effect on the thrust-to-power ratio generated by the turbine configurations under consideration of the reduction in aircraft weight over the course of a particular flight as fuel is consumed.

An example of an optimization routine would take into account the reduction in the aircraft weight as fuel is consumed and the lift required for level flight is reduced. Likewise, changes in altitude will change the density of the air. Both of these will affect the strength F of the vortex, which is a function of both as indicated in equation (4). This would permit the aircraft designer to determine the power/thrust ratio at different points in the aircraft's mission envelope and make changes to the blades' pitch (or other turbine characteristics) as needed to provide a ratio more suited to the aircraft's entire mission.

Another optimization routine available to an aircraft designer can be used to explore the effect of mounting the turbine optimum at a location other than at the wingtip. For example, the designer could ask the program to calculate the power/thrust ratio provided by a particular turbine configuration at a series of locations inboard of the wingtip and/or below the trailing edge. This would permit the designer to mount a turbine according to the design on the actual aircraft at the optimum location.

The final result is a prediction of the maximum amount of thrust and power meeting the design target that can be generated from a wing-mounted turbine. Final aircraft design considerations would take into account factors such as increased fuel consumption resulting from the added weight of the turbines, although that could potentially be mitigated by making it possible to use lighter APUs that generate less power, or possibly eliminate the need for any APUs at all. The final design would also take into account any structural modifications to the aircraft required to support the turbines from the wings.

III. ALTERNATE METHOD FOR DESIGNING THE WING-MOUNTED TURBINE

FIG. 10 is a flowchart of an alternate method for configuring the wing-mounted turbine 100. The step S200 selects the parameters defining the aerodynamic characteristics of the actual aircraft under consideration, including the aircraft wings. This step is analogous to the step 108 in the method illustrated in FIG. 8 already described and involves applying the same criteria discussed in connection with that step. Next, in the step S202, the aircraft designer selects one or more target output values for the ratio of power to thrust to be recovered from the vortices trailing the wings of the aircraft AC. This is analogous to the step S104 in FIG. 8 and also involves applying the same criteria discussed in connection therewith. The final step S204 is identical to the step S106 depicted in FIG. 8 and involves the procedures discussed in connection with that step.

This method eliminates the steps of the first preferred embodiment that identify a preliminary turbine configuration based on an idealized vortex model. It will typically use a process similar to that used in the step S112, but one also capable of determining the values of the specified turbine parameters via an optimization procedure like that described in the previous section. That analysis would instead be based on the complex flow characteristics trailing the aircraft/turbine combination and without the parameter values of a preliminary configuration. However, in most cases it will involve substantially more time than first identifying a preliminary configuration using a less computational intensive program.

IV. SUMMARY AND CONCLUSIONS

To fully realize the benefits of using wing-mounted turbines as described here, the aircraft must be analyzed as a complete system to account for the addition of the extra weight of the turbines and the aeroelastic effects of suspending them from the aircraft wings. A complete aircraft design can be performed once a family of aerodynamically viable wingtip turbine configurations has been identified that can be used for the complete aircraft system. The ultimate aircraft weight will be affected by the addition of the turbines 100, the various electrical components required for using the current they generate (inverters, controllers, and the like), any additional wing structural enhancements required to support the turbines, and any supplemental batteries required if retrofitting an existing aircraft using APUs or engine bleed systems for operating various aircraft systems. Aeroelastic effects of all of the aircraft configuration changes will have to be determined as well.

An example of a systems approach to implementing a wing-mounted turbine can quantify changes in aircraft weight and performance using a turbine configuration determined in accordance with the preceding embodiments. Taking the case of an aircraft in steady level flight, where thrust equals drag and lift equals weight, the amount of fuel f in kg consumed over a given range M in kilometers can be estimated from the following equation:

$$f = \int_0^M \frac{cT}{V_\infty} dx \qquad (6)$$

where c=thrust specific fuel consumption in kg/(hr-Newton), T is thrust in Newtons, and $V_\infty$ is the airspeed in km/hr. Equation (6) is effectively the inverse of the Breguet Range Equation since it integrates over the distance traveled instead of over the amount of fuel consumed.

Most fuel is consumed during the cruise segment of an aircraft mission envelope, whereby assuming T (thrust)=D (drag) and L (lift)=W (weight), and that c, L/D and $V_\infty$ are constant, equation (5) can be approximated as:

$$f = \frac{Mc}{V_\infty L/D} \overline{W} \qquad (7)$$

$$\text{where } \overline{W} = \frac{1}{M} \int_0^M W \, dx \qquad (8)$$

Having an estimate of fuel consumption over a given range M, the total weight savings associated with the installation of wingtip turbines in accordance with the methods described above can be quantified. Aircraft-specific savings can be extrapolated across an entire fleet to estimate total savings in terms of fuel, costs and $CO_2$ emissions. The weight reduction resulting from the addition of wing-mounted turbines could also be used to increase the aircraft's passenger capacity.

Those skilled in the art will readily recognize that only selected preferred embodiments of the methods and constructions and their concomitant advantages have been depicted and described, and it will be understood that various changes and modifications can be made other than those specifically mentioned above without departing from the spirit and scope of inventions described here and defined solely by the claims that follow.

What is claimed is:

1. A method of configuring a turbine for use on an aircraft having a wing with a distal wingtip, said wing providing a lift force supporting an aircraft when in flight in a predetermined direction at a particular freestream velocity $V_\infty$, the method comprising:

modeling said turbine with a construction including turbine blades extending from a proximal blade root to a distal blade tip for providing a specified weighted combination of a propulsive force in the predetermined direction to an amount of power generated by said turbine when said turbine is mounted proximate the trailing edge of said wing at a location where an airflow trailing said wing when said aircraft is traveling at $V_\infty$ in said predetermined direction is introduced to a turbine inlet; and constructing said turbine according to said modeling step, wherein said turbine includes:
- a plurality of said turbine blades with a predetermined airfoil profile mounted to a turbine shaft and arranged around a turbine axis for rotating said turbine shaft in the presence of the airflow introduced to the turbine inlet; and
- an electrical generator operatively connected to the turbine shaft for providing electricity to the aircraft when the turbine shaft is rotated by said airflow.

2. The method of claim 1, wherein said modeling step comprises determining values of a set of turbine parameters related to the turbine geometry and rate of rotation that will maximize the amount of propulsive force and power generated by said turbine in said specified weighted combination.

3. The method of claim 2, wherein said set of turbine parameters includes at least the number of said blades; the turbine radius from the turbine axis to said blade tips; blade pitch; and blade twist and chord profiles comprising functions of the distance from the blade root to the blade tip.

4. The method of claim 3, wherein said set of turbine parameters further includes blade sweep.

5. The method of claim 4, wherein:
- said predetermined direction defines a positive y-axis of a coordinate system with mutually orthogonal x- and z-axes; and
- a chord line of each of said blade includes a swept portion comprising a function of the distance from the blade root to the blade tip, said swept portion having a chord line in the x-y plane and extending in the positive y-direction at an acute angle relative to the x-z plane.

6. The method of claim 5, wherein said swept portion extends to said blade tip from a predetermined location spaced from said blade root.

7. The method of claim 3, wherein:
- said predetermined direction defines a positive y-axis of a coordinate system with mutually orthogonal x- and z-axes; and
- said turbine parameters further include a blade anhedral portion comprising an anhedral profile as a function of the distance from the blade root to the blade tip, said blade anhedral portion having a chord line in the x-z plane and extending in the positive z-direction at an acute angle relative to the x-y plane.

8. The method of claim 2, wherein all of said specified weighted combination comprises said propulsive force.

9. The method of claim 2, wherein all of said specified weighted combination comprises said power.

10. The method of claim 1, wherein the turbine blades can be rotated about an axis normal to said turbine axis to vary blade pitch.

11. A method of configuring a turbine for use on an aircraft with a particular configuration including at least two wings, each said wing having a distal wingtip and providing a lift force supporting the aircraft in flight in a predetermined direction at a particular freestream velocity $V_\infty$, wherein said turbine includes:
the method comprising:
- modeling the fluid flow trailing said wings;
- identifying a preliminary turbine construction including turbine blades extending from a proximal blade root to a distal blade tip and being defined by preliminary values of a set of turbine parameters that provides a weighted combination of a propulsive force along a turbine axis to an amount of power generated by said turbine when said fluid flow is introduced to a turbine inlet, wherein said set of turbine parameters includes at least (i) a number of said blades, (ii) a turbine radius from the turbine axis to said blade tips, (iii) blade pitch, and (iv) blade twist and chord profiles comprising functions of the distance from the blade root to the blade tip;
- determining final values of a corresponding set of turbine parameters by modifying selected ones of said preliminary values to define a final turbine construction that provides a specified said weighted combination of the propulsive force in the predetermined direction to an amount of power generated by said final turbine construction when mounted proximate the trailing edge of each said wing at a location where an airflow trailing said wing when said aircraft is traveling at $V_\infty$ in said predetermined direction is introduced to said turbine inlet; and
- constructing said turbine according to said final values of said turbine parameters, wherein said turbine includes:
- a plurality of said turbine blades with a predetermined airfoil profile mounted to a turbine shaft and arranged around the turbine axis for rotating said turbine shaft in the presence of the airflow introduced to the turbine inlet; and
- an electrical generator operatively connected to the turbine shaft for providing electricity to the aircraft when the turbine shaft is rotated by said airflow.

12. The method of claim 11, wherein said turbine parameters further include blade sweep.

13. The method of claim 11, wherein said final values of said turbine parameters have values related to the turbine geometry and rate of rotation that will maximize the amount of propulsive force and power generated by said turbine in said specified weighted combination.

14. The method of claim 13, wherein all of said specified weighted combination comprises said propulsive force.

15. The method of claim 13, wherein all of said specified weighted combination comprises said power.

16. The method of claim 13, wherein said predetermined direction and freestream velocity represent an aircraft cruise flight condition at constant altitude and airspeed.

17. The method of claim 11, wherein said fluid flow trailing said wings is modeled numerically and the wing provides a particular lift force when traveling at $V_\infty$ at a predetermined altitude.

18. The method of claim 11, wherein said determining step includes an optimization process that maintains at least one of said turbine parameters fixed and uses another of said turbine parameters as a control parameter incrementally varied in each step of said process to identify a value of said control parameter and each of the values of a remaining set of turbine parameters that define a turbine construction that provides said specified weighted combination of propulsive force to amount of power.

19. The method of claim 18, wherein the fixed parameter is the blade pitch, the control parameter is said blade twist profile, and said remaining turbine parameters include (i) the number of said blades, (ii) said turbine radius, and (iii) said blade twist and chord profiles.

20. The method of claim 18, wherein said optimization process is performed by a computer program that assumes azimuthal symmetry in its flow solution.

21. The method of claim 20, wherein said remaining turbine parameters further include blade sweep.

22. The method of claim 11, wherein said modeling step models the fluid flow trailing said wings as a vortex based on an idealized vortex model comprising:

a circular core having a core radius $r_c$ measured from a vortex axis and a maximum tangential velocity $V_{\theta max}$ at the core radius $r_c$, and a tangential velocity profile expressed as a function $V_\theta(r_v)$ of the distance $r_v$ from the vortex axis and predetermined values of $r_c$ and $V_{\theta max}$.

23. The method of claim 22, wherein said predetermined values of $V_{\theta max}$ and $r_c$ are based on experimental data.

24. The method of claim 11, wherein the turbine blades can be rotated about an axis normal to said turbine axis to vary blade pitch.

25. A method of configuring a turbine having turbine blades extending from a proximal blade root to a distal blade tip for use on an aircraft with a particular configuration including at least two wings, each said wing having a distal wingtip and providing a lift force supporting the aircraft in flight in a predetermined direction at a particular freestream velocity $V_\infty$, the method comprising:

selecting a set of turbine parameters including at least (i) a number of said turbine blades, (ii) a turbine radius from a turbine axis to said blade tips, (iii) blade pitch, and (iv) blade twist and chord profiles comprising functions of the distance from the blade root to the blade tip;

modeling the fluid flow trailing said wings; and constructing said turbine with a particular set of said turbine parameters determined according to said modeled fluid flow, wherein said turbine includes a plurality of said turbine blades with a predetermined airfoil profile mounted to a turbine shaft and arranged around the turbine axis for rotating said turbine shaft in the presence of the modeled fluid flow introduced to a turbine inlet, said airfoil profile being defined by values of said set of turbine parameters that provide a specified weighted combination of a propulsive force along the turbine axis to an amount of power generated by said turbine when said turbine is mounted proximate the trailing edge of each said wing at a location where said fluid flow trailing said wing when said aircraft is traveling at $V_\infty$ in said predetermined direction is introduced to the turbine inlet.

26. The method of claim 25, wherein said constructing step includes an optimization process that maintains at least one of said turbine parameters fixed and uses another of said turbine parameters as a control parameter incrementally varied in each step of said process to identify a value of said control parameter and each of the values of a remaining set of turbine parameters that define a turbine construction that provides said specified weighted combination of propulsive force to amount of power.

27. The method of claim 26, wherein the fixed parameter is the blade pitch, the control parameter is said blade twist profile, and said remaining turbine parameters include (i) the number of said blades, (ii) said turbine radius, and (iii) said blade twist and chord profiles.

28. The method of claim 25, wherein the turbine blades can be rotated about an axis normal to said turbine axis to vary blade pitch.

\* \* \* \* \*

UNITED STATES PATENT AND TRADEMARK OFFICE
CERTIFICATE OF CORRECTION

PATENT NO. : 12,258,143 B2
APPLICATION NO. : 18/440997
DATED : March 25, 2025
INVENTOR(S) : Glen R. Whitehouse et al.

It is certified that error appears in the above-identified patent and that said Letters Patent is hereby corrected as shown below:

In the Specification

Column 4, Line 41, should read -- vortical flow are assumed, Bilanin's solution yields a minus --.

Column 8, Line 59, should read -- sweep angle $\lambda$ between the x-axis and the ¼-chord line 216 --.

Column 8, Line 60, should read -- in the swept region 214. By convention, $\lambda$ is positive in the --.

Column 11, Line 30, should read -- of $\Gamma$ to use in the Rankine model in Leishman. For example, --.

Column 11, Line 31, should read -- $\Gamma$ for a theoretically elliptically loaded wing is given by the --.

Column 12, Line 33, should read -- number of blades N, and turbine rotation rate $\omega$. Additional --.

Column 12, Line 50, should read -- blade pitch $\theta_p$ and rotation rate $\omega$, one is kept constant as a --.

Column 16, Line 28, should read -- the results obtained using different values for blade pitch $\theta_p$ --.

Column 16, Line 59, should read -- air. Both of these will affect the strength $\Gamma$ of the vortex, --.

Column 19, Line 56, should read -- direction at a particular freestream velocity $V_\infty$, --.

Column 19, Line 57, should be deleted.

Signed and Sealed this
Sixth Day of May, 2025

Coke Morgan Stewart
*Acting Director of the United States Patent and Trademark Office*